United States Patent
Kakoschke

(10) Patent No.: US 6,177,702 B1
(45) Date of Patent: Jan. 23, 2001

(54) SEMICONDUCTOR COMPONENT WITH A SPLIT FLOATING GATE AND TUNNEL REGION

(75) Inventor: Ronald Kakoschke, München (DE)

(73) Assignee: Infineon Technologies AG, Munich (DE)

(*) Notice: Under 35 U.S.C. 154(b), the term of this patent shall be extended for 0 days.

(21) Appl. No.: 09/169,774

(22) Filed: Oct. 9, 1998

Related U.S. Application Data

(63) Continuation of application No. PCT/DE97/00722, filed on Apr. 9, 1997.

(30) Foreign Application Priority Data

Apr. 9, 1996 (DE) ............................................ 196 14 011

(51) Int. Cl.[7] .................................................. H01L 29/788
(52) U.S. Cl. .......................... 257/321; 257/250; 257/315; 257/316; 257/317; 257/318; 257/319; 257/320; 257/322
(58) Field of Search ............................ 257/250, 315–322

(56) References Cited

U.S. PATENT DOCUMENTS

| | | | | |
|---|---|---|---|---|
| 5,404,037 | * | 4/1995 | Manley | 257/321 |
| 5,429,960 | * | 7/1995 | Hong | 438/201 |
| 5,840,607 | * | 11/1998 | Yeh et al. | 438/201 |
| 5,850,092 | * | 12/1998 | Capelletti | 257/321 |
| 5,859,455 | * | 1/1999 | Yu | 257/321 |
| 5,889,700 | * | 3/1999 | Bergemont et al. | 365/185.18 |

FOREIGN PATENT DOCUMENTS

| | | |
|---|---|---|
| 196 11 438 A1 | 9/1996 | (DE) . |
| 0 204 498 A2 | 12/1986 | (EP) . |
| 0 655 785 A2 | 5/1995 | (EP) . |
| 5-226662 | 9/1993 | (JP) . |
| 6-77498 | 3/1994 | (JP) . |

OTHER PUBLICATIONS

Japanese Patent Abstract No. 58121680 (Ryuichi), dated Jul. 20, 1983.
A High Capacitive–Coupling Ratio (HiCR) Cell for 3 V–Only 64 Mbit and Future Flash Memories, Hisamune et al., IEDM pp. 19–22.

* cited by examiner

Primary Examiner—Fetsum Abraham
(74) Attorney, Agent, or Firm—Herbert L. Lerner; Laurence A. Greenberg; Werner H. Stemer

(57) ABSTRACT

An avalanche breakdown from the buried channel to the substrate in a semiconductor component, in particular an EEPROM, is avoided by a local thickened portion of the gate dielectric. The thickened portion establishes an insulation structure at the transition to the tunnel dielectric. This produces a potential barrier which enables the gate dielectric and the tunnel dielectric to have the same thickness. The space requirement of such a cell is reduced.

7 Claims, 3 Drawing Sheets

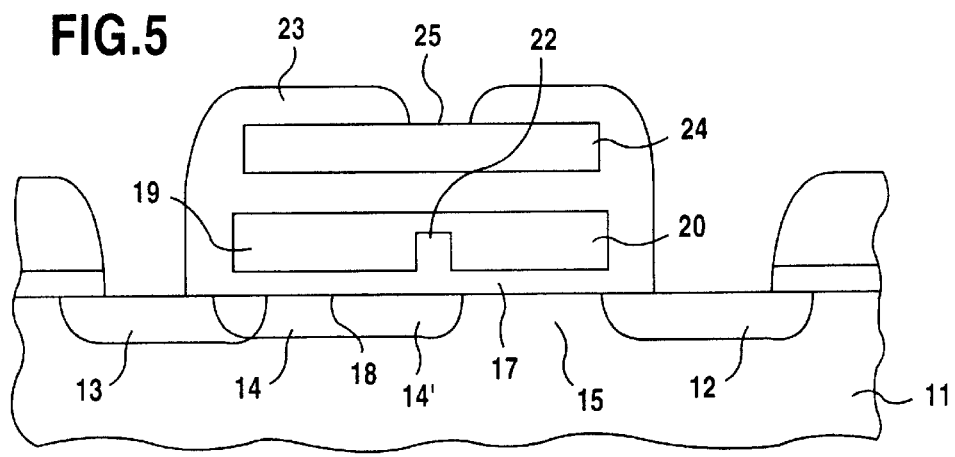
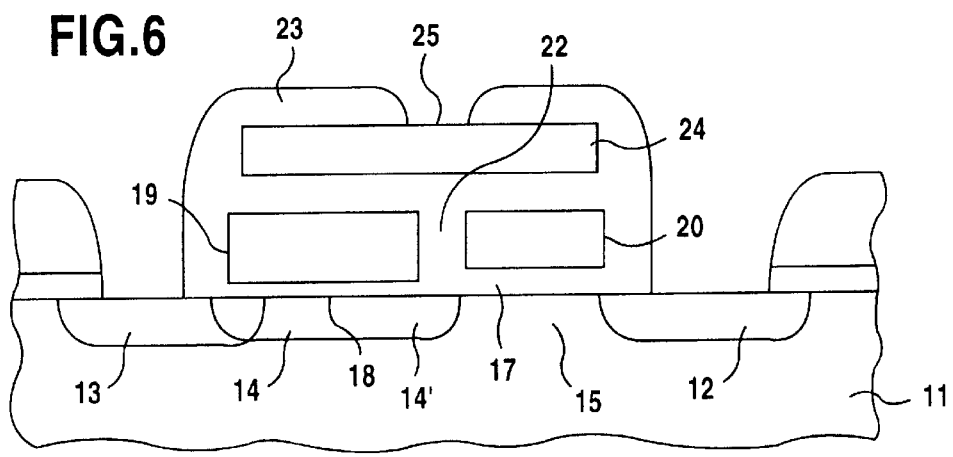
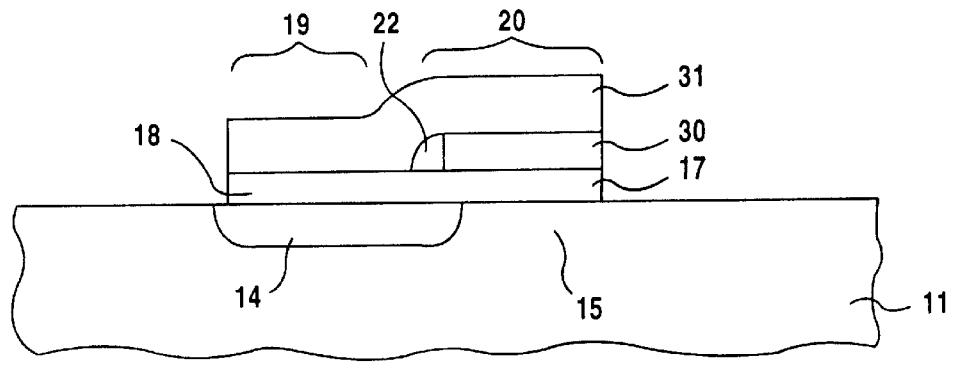

SEMICONDUCTOR COMPONENT WITH A SPLIT FLOATING GATE AND TUNNEL REGION

CROSS-REFERENCE TO RELATED APPLICATION

This is a continuation of copending international application PCT/DE97/00722, filed Apr. 9, 1997, which designated the United States.

BACKGROUND ON THE INVENTION

FIELD OF THE INVENTION

The invention belongs to the semiconductor field. More specifically, the invention relates to a semiconductor component with a first and a second doped region of a second conductivity type disposed in a semiconductor substrate of a first conductivity type, and with a channel region in the semiconductor substrate between the two doped regions. In particular, the invention relates to EEPROM memory cells.

EEPROM cells (electrically erasable and programmable read-only memory cells) constitute a memory type which is growing in importance. For example, memory blocks of the FLOTOX cell type (floating gate tunnel oxide) integrated in a microcontroller environment (embedded memories) are used for smart card applications. Increasingly smaller cells are desired and required. One limiting factor is the shrinkability of the tunnel window with the associated electrical terminal region (buried channel). That limit is primarily determined by the properties of the device, as described in the following text and in my copending application entitled "Semiconductor Component with Adjustable Current Gain Based on Tunneling Current-Controlled Avalanche Breakdown" (published WO 97/38448), which is herewith incorporated by reference.

The drawing FIG. 1 is a diagrammatic illustration of a FLOTOX type EEPROM cell. Two n-doped regions 2, 3 form the source and drain, respectively, in a p-doped semiconductor substrate 1. A floating gate 6 is disposed on the substrate surface lying between the source and the drain. The gate 6 is isolated from the substrate by a gate dielectric 7 and a tunnel dielectric 8. The floating gate 6 is "connected" to the drain via the tunnel dielectric (the so-called tunnel window) and via an n-doped region 4 which is referred to as buried channel. The region underneath the gate oxide of the memory transistor, the so-called channel region 5, is weakly p-doped. The gate dielectric 7 covers not only the channel region 5 but also an edge region 4' of the buried channel 4. A control gate 9 with a terminal 10 is arranged above the floating gate 6. The following voltages, roughly, are set for the purpose of programming:

$U_{controlgate} = 0V$ $U_{Drain} = +15V$ $U_{Source}$-floating

Electrons pass from the floating gate through the potential barrier in the oxide into the conduction band of the oxide and then into the substrate. This is illustrated as a band diagram in FIG. 2. In the process, the electrons take up enough energy to produce electron-hole pairs in the substrate. (Holes tend to move along the top edge of the valence band to a higher potential—in other words upwards in the drawing—corresponding to a lower potential for holes.)

Referring now to FIG. 3, there is shown the potential profile along the interface perpendicularly to the drawing plane of FIG. 2 (in other words along the axis III—III' in FIG. 1) with a large lateral extent of the edge region 4' for different values of $U_{buried\ channel}$. The pn junction between the buried channel 4 (n-doped) and the substrate (p-doped) is reverse-biased at these voltages. This leads to a large potential gradient. At the tunnel-to-gate dielectric transition, a small potential barrier Pb also forms both in the conduction band and in the valence band, since the potential at the interface depends on the thickness of the superior dielectric: the hole potential in the tunnel oxide region is higher than in the gate oxide region. The hole potential drop Pa to the p-type region does not begin until the drop in the concentration of the doping. If the level of this potential barrier is always (for holes) above the buried channel potential, holes cannot escape from the buried channel region 4.

Referring now to FIG. 4, if the lateral extent of the edge region 4' underneath the gate dielectric 7 is insufficient, the hole potential drop Pa begins earlier. The barrier Pb lies in the falling branch and drops below the buried channel level. The holes produced by the tunneling electrons can therefore escape from the region under the tunnel dielectric 8 and traverse the hole potential gradient towards the channel region 5. Holes are now no longer held in the buried channel region. Further electron-hole pairs are generated in the process due to collision ionization. This leads to charge multiplication, with the result that the current from the buried channel 4 to the channel region 5, that is to say into the substrate 1, is many orders of magnitude ($10^4$ to $10^6$) above the tunneling current. The charge pump for generating the programming voltage cannot deliver such a current. The cells cannot be programmed in the required time of a few milliseconds. Furthermore, the parasitic current generated by the charge multiplication loads the tunnel oxide and thus reduces the cycle stability.

The level of the potential barrier is of decisive importance for the programming operation and the electrical reliability of the component. The level of the potential barrier can be set by:

the lateral extent of the edge region 4';

the thickness ratio of the tunnel dielectric to the gate dielectric; and the lateral doping profile around the gate oxide-tunnel oxide edge.

A substantial degree of lateral outdiffusion of the n-doping element (usually phosphorus) is necessary in order to obtain a sufficient extent of the edge region 4' underneath the gate dielectric 7. This can be achieved by a high implantation dose. The distance between the gate oxide-tunnel oxide edge and the source region must be correspondingly large, in order that the channel length of the memory transistor does not become too short as a result of the lateral diffusion. A high buried channel concentration additionally has an unfavorable effect on the quality of the tunnel oxide. Furthermore, the sufficient extent of the edge region 4' is usually ensured by using two different masks to define the buried channel 4 and the tunnel window. The implantation mask for the buried channel therefore has a larger opening than the etching mask for the tunnel window.

Another way of avoiding avalanche breakdown is a large thickness ratio of the gate dielectric to the tunnel dielectric ($\geq 4$). If this ratio is to be reduced, the lateral shrink limits of the component are encountered.

SUMMARY OF THE INVENTION

It is accordingly an object of the invention to provide a semiconductor component with a split floating gate, which overcomes the above-mentioned disadvantages of the heretofore-known devices and methods of this general type and which, in particular, provides for an EPROM having a low space requirement and high electrical reliability.

With the foregoing and other objects in view there is provided, in accordance with the invention, a semiconductor component, comprising:

a semiconductor substrate of a first conductivity type;

a first doped region of a second conductivity type formed in the semiconductor substrate, the first doped region having a surface and an edge region;

a second doped region of the second conductivity type formed in the semiconductor substrate;

a channel region disposed in the semiconductor substrate between the first and second doped regions;

a tunnel dielectric partially covering the surface of the first doped region;

a gate dielectric covering a surface of the channel region and the edge region of the first doped region;

a tunnel gate electrode having a surface disposed on the tunnel dielectric;

a channel gate electrode having a surface disposed on the gate dielectric; and an insulation structure separating the tunnel gate electrode and the channel gate electrode at least at the surface facing the tunnel dielectric and the gate dielectric, respectively.

In accordance with an added feature of the invention, the insulation structure completely separates the tunnel gate electrode from the channel gate electrode.

In accordance with an alternative feature of the invention, the tunnel gate electrode and the channel gate electrode are conductively connected to one another at a surface thereof facing away from the tunnel dielectric and the gate dielectric, respectively.

In accordance with an additional feature of the invention, the tunnel dielectric and the gate dielectric have the same layer thickness.

In accordance with another feature of the invention, the channel gate electrode is formed of a first conductive layer and a second conductive layer, the tunnel gate electrode is composed of the second conductive layer, and the insulation structure is a spacer.

In accordance with a further feature of the invention, the tunnel gate electrode is formed of a first conductive layer and a second conductive layer, the channel gate electrode is composed of the second conductive layer and the insulation structure is a spacer.

In accordance with a concomitant feature of the invention, the insulation structure covers the edge region of the first doped region.

The potential barrier Pb that prevents an avalanche breakdown can be set by locally increasing the layer thickness of the gate dielectric at the transition from the tunnel dielectric to the gate dielectric. The tunnel electrode and the channel gate electrode are therefore separated, at least at their surface facing the tunnel dielectric and the gate dielectric, respectively, by an insulation structure which is arranged on the gate dielectric. The dimensions and the position of this insulation structure determine the potential barrier. The insulation structure can be arranged above an edge region of the buried channel. In that case it preferably completely covers the edge region and reaches up to the pn junction. As recited in one of the claims, it can also extend over part of the channel region and therefore cover the pn junction.

The tunnel electrode and the channel gate electrode can be connected to one another in the region that is not occupied by the insulation web, for example at their surface facing away from the tunnel dielectric and the gate dielectric, respectively. This connection may have the same layer thickness as the electrodes. Alternatively, the insulation web may completely separate the two electrodes from one another, and then an external connection of the two gates is preferably provided.

Since the potential barrier is obtained by the insulation structure, the layer thicknesses of the gate dielectric and the tunnel dielectric can be selected freely and are not critical with regard to avoiding an avalanche breakdown. The two dielectrics may also have the same layer thickness, which simplifies the manufacture of the device considerably.

The tunnel gate electrode and the channel gate electrode can be produced from the same conductive layer, the insulation structure preferably being produced beforehand. As an alternative, they can be produced from successively applied layers and the insulation web can then be formed by a spacer.

Other features which are considered as characteristic for the invention are set forth in the appended claims.

Although the invention is illustrated and described herein as embodied in a semiconductor component having a divided floating gate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 is a section through a semiconductor substrate with a memory cell according to the invention;

FIG. 6 is a section through a further embodiment of the invention; and

FIG. 7 is a section through a semiconductor substrate used to illustrate a novel production method.

DESCRIPTION OF THE PREFERRED EMBODIMENTS

Figure 1:
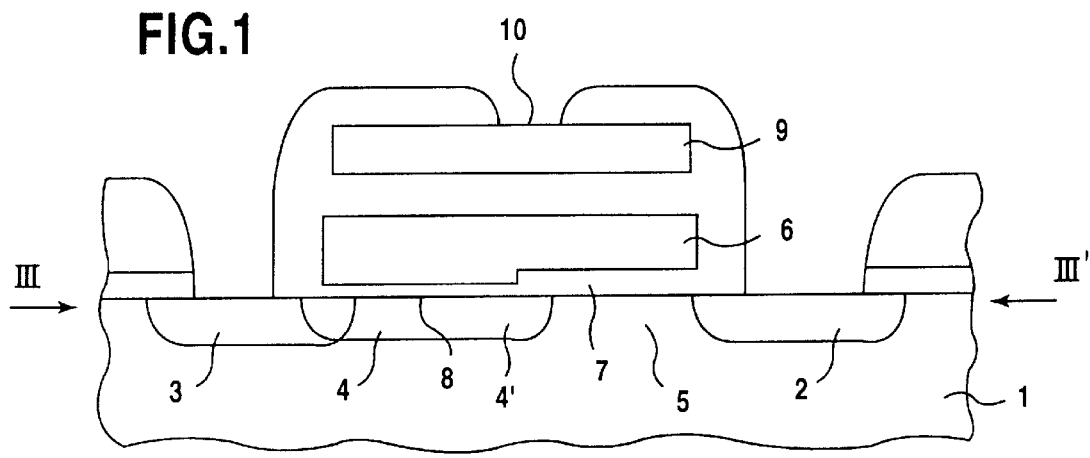
FIG. 1 is a section through a semiconductor substrate with a prior art EEPROM memory cell.
Figure 2:
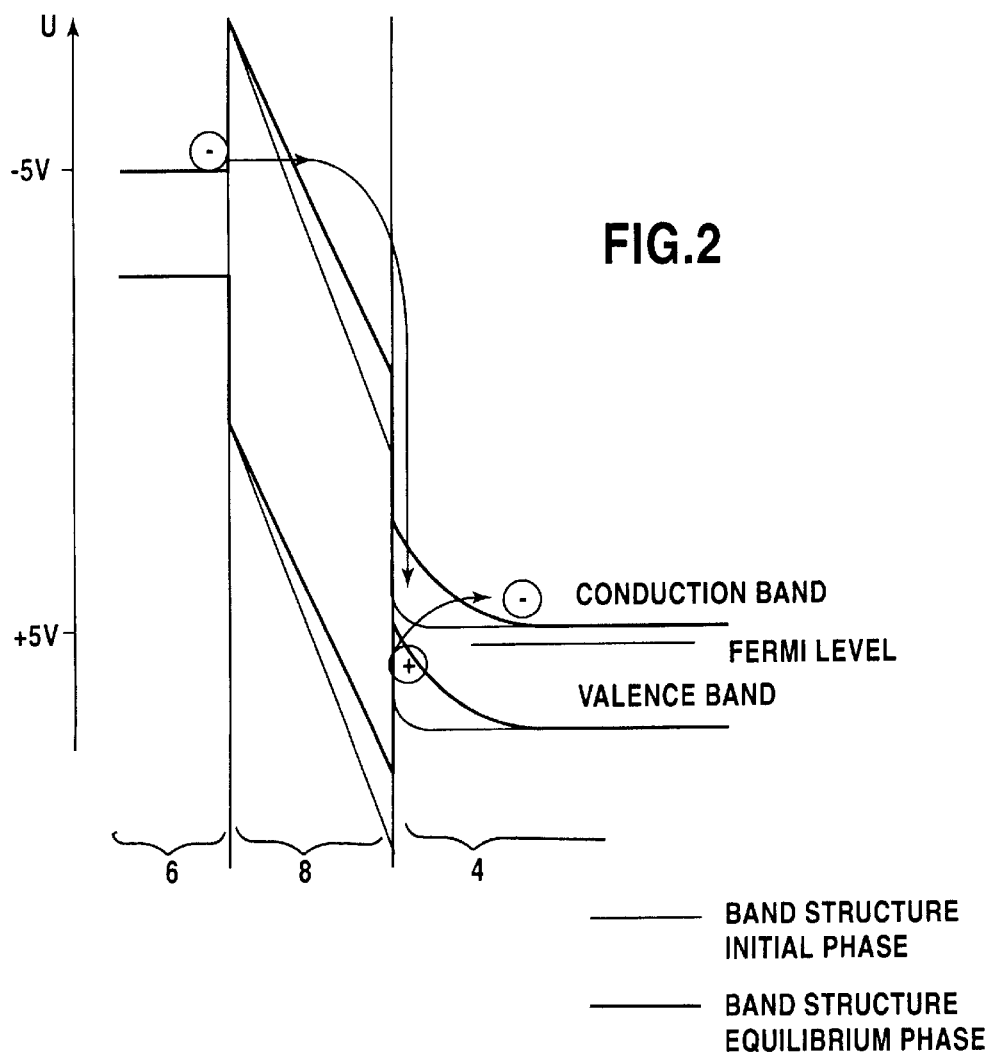
FIG. 2 is a is diagram showing a potential profile along a given direction in the semiconductor substrate.
Figure 3:
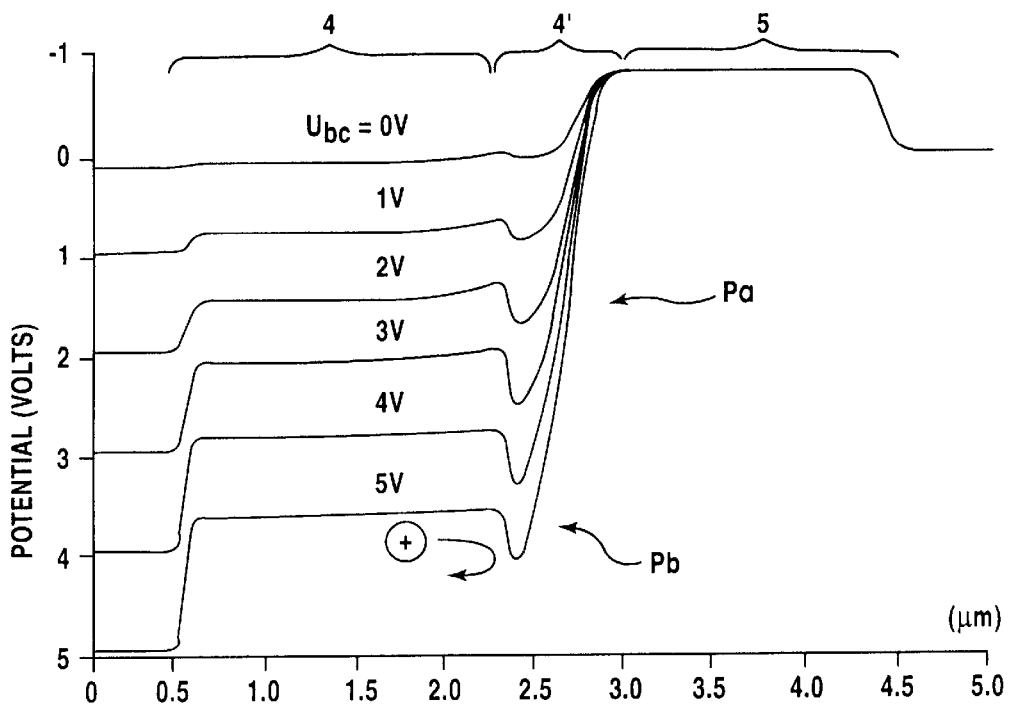
FIGS. 3 is a diagram showing the potential profile along the axis III—III' in FIG. 1.
Figure 4:
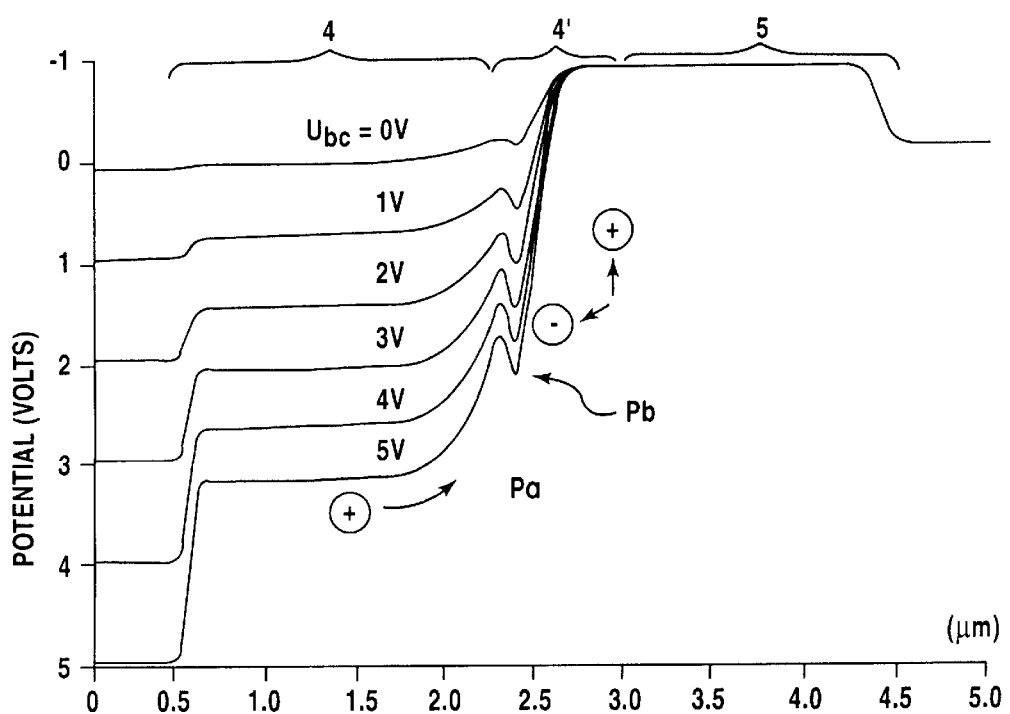
FIG. 4 is a further diagram showing the potential profile.

Referring first to FIG. 5, a first n-doped region 14, which is usually referred to as a buried channel, and a second n-doped region 12 are situated in a p-doped silicon semiconductor substrate 11. The substrate region between these doped regions is referred to as channel region 15. A gate oxide 17 covers the surface of the channel region 15, a tunnel oxide 18 partially covers the surface of the buried channel 14. A gate electrode—a floating gate—is disposed above the dielectrics. To this extent, the memory cell of FIG. 5 corresponds to the memory cell of FIG. 1.

According to the invention, an insulation structure 22 is provided at the transition from the tunnel dielectric to the gate dielectric. The insulation structure 22 is arranged above the edge region 14' of the buried channel and constitutes a local thickened portion of the gate dielectric. This results in the necessary potential barrier. It separates the gate electrode into a tunnel gate electrode 19 above the tunnel oxide 18 and into a channel gate electrode 20 above the gate oxide. In this exemplary embodiment, the tunnel electrode and the gate electrode are not completely separated, but are connected to one another above the insulation web. The layer thicknesses of the tunnel oxide and the gate oxide are identical and amount to about 8 nm.

The remaining structure corresponds to that of a prior art EEPROM cell. A control gate 24 with a terminal 25 is arranged above the floating gate 19, 20. The gate 24 is thereby insulated from the floating gate 19, 20 and the gates are covered on all sides with an insulating layer 23. The buried channel region 14 can be connected directly or via an n-doped region (drain) 13.

The configuration could be used, for example, in EEPROMs of the FLOTOX and flash types. When a flash cell is erased ($U_{source}$=+8 V and $U_{CG}$=−8 V), electrons tunnel from the floating gate into the source region. Without the insulation structure, there would be no potential barrier (or the risk of an insufficient potential barrier given different thicknesses of the tunnel oxide and the gate oxide). During each erase operation, charge multiplication is initiated and hot charge carriers are generated. As a result, the thin tunnel oxide (or gate oxide) is stressed and the number of write-erase cycles is considerably reduced.

In the case of FLOTOX cells, it is possible to use insulation instead of the transition from the tunnel dielectric to the gate dielectric with short-circuited electrodes. As explained at the beginning, the outdiffusion of the first doped region (buried channel) can be greatly reduced by this, thereby enabling smaller cells to be realized.

Referring now to FIG. 6, there is shown a further embodiment with a memory cell in which the insulation structure 22 completely divides the floating gate into the tunnel gate 19 and the channel gate 20. The two gates can be externally connected to one another in a conductive manner by further conductive tracks. The tunnel oxide 18 is, for example, about half as thick as the gate oxide 17. The reference numerals are assigned as in FIG. 5.

Referring now to FIG. 7, there is illustrated a simple method for producing the floating gate of FIG. 6—for a flash cell or for a FLOTOX cell.

The gate oxide 17 is produced on the silicon substrate 11 by any conventional process. A first conductive layer 30, for example a polysilicon layer, is applied on the gate oxide. The polysilicon layer is structured corresponding to the channel gate electrode 20, and an insulating spacer, which represents the insulation web 22, is produced using conventional processes. The buried channel 14 is then implanted with the aid of a photomask. If appropriate, the gate oxide is removed—for this purpose it is possible to use the same photomask as for the buried channel implantation—and a tunnel oxide 18 is applied. A second conductive layer 31 (preferably polysilicon) is then deposited. This layer is structured corresponding to the floating gate 19, 20. The further method steps (implantations, insulation of the gate, etc.) can be carried out in accordance with state of the art process control.

The floating gate produced in this way consists of a tunnel gate electrode 19, which is composed of the second conductive layer 31, and a channel gate electrode 20, which is composed of the two conductive layers 30, 31. The two electrodes are connected to one another via the second conductive layer 31. In an analogous manner, such a method can be used to produce a configuration in which the channel gate electrode 20 is composed of the second conductive layer 31 and the tunnel and electrode 19 is composed of the two conductive layers 30, 31.

I claim:

1. A semiconductor component, comprising:

a semiconductor substrate of a first conductivity type;

a first doped region of a second conductivity type formed in said semiconductor substrate, said first doped region having a surface and an edge region;

a second doped region of the second conductivity type formed in said semiconductor substrate;

a channel region disposed in said semiconductor substrate between said first and second doped regions;

a tunnel dielectric partially covering said surface of said first doped region, said tunnel dielectric having a given thickness;

a gate dielectric covering a surface of said channel region and said edge region of said first doped region, said gate dielectric having a thickness substantially equal to said given thickness;

a tunnel gate electrode having a surface disposed on said tunnel dielectric;

a channel gate electrode having a surface disposed on said gate dielectric; and an insulation structure made of a dielectric material separating said tunnel gate electrode and said channel gate electrode at least at said surface facing said tunnel dielectric and said gate dielectric, respectively.

2. The semiconductor component according to claim 1, wherein said insulation structure completely separates said tunnel gate electrode from said channel gate electrode.

3. The semiconductor component according to claim 1, wherein said tunnel gate electrode and said channel gate electrode are conductively connected to one another above said insulation structure.

4. The semiconductor component according to claim 1, wherein said tunnel dielectric and said gate dielectric have an identical layer thickness.

5. The semiconductor component according to claim 1, wherein said channel gate electrode is formed of a first conductive layer and a second conductive layer, said tunnel gate electrode is composed of said second conductive layer and said insulation structure is a spacer.

6. The semiconductor component according to claim 1, wherein said tunnel gate electrode is formed of a first conductive layer and a second conductive layer, said channel gate electrode is composed of said second conductive layer and said insulation structure is a spacer.

7. The semiconductor component according to claim 1, wherein said insulation structure covers said edge region of said first doped region.

\* \* \* \* \*